(12) United States Patent
Nakao et al.

(10) Patent No.: US 10,199,590 B2
(45) Date of Patent: Feb. 5, 2019

(54) PHOTOVOLTAIC CELL MODULE

(71) Applicant: KABUSHIKI KAISHA TOSHIBA, Minato-ku, Tokyo (JP)

(72) Inventors: Hideyuki Nakao, Tokyo (JP); Satoshi Takayama, Kanagawa-ken (JP); Akihiko Ono, Tokyo (JP); Haruhi Oooka, Kanagawa-ken (JP); Michihiko Inaba, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/361,705

(22) Filed: Nov. 28, 2016

(65) Prior Publication Data

US 2017/0077432 A1 Mar. 16, 2017

Related U.S. Application Data

(63) Continuation of application No. 14/027,526, filed on Sep. 16, 2013, now abandoned.

(30) Foreign Application Priority Data

Sep. 26, 2012 (JP) .................. 2012-213104

(51) Int. Cl.
| | |
|---|---|
| *H01L 31/042* | (2014.01) |
| *H02N 6/00* | (2006.01) |
| *H01L 51/42* | (2006.01) |
| *H01L 31/05* | (2014.01) |
| *H01L 27/30* | (2006.01) |
| *H01L 51/44* | (2006.01) |
| *H01L 51/00* | (2006.01) |

(52) U.S. Cl.
CPC ........ *H01L 51/4273* (2013.01); *H01L 27/301* (2013.01); *H01L 31/0504* (2013.01);
(Continued)

(58) Field of Classification Search
CPC . H01L 51/4273; H01L 51/442; H01L 27/301; H01L 31/0504; H01L 2251/308;
(Continued)

(56) References Cited

U.S. PATENT DOCUMENTS

2005/0236037 A1* 10/2005 Ahn ................ H01G 9/2081
136/263
2006/0131566 A1* 6/2006 Liu ................ H01L 27/283
257/40
(Continued)

FOREIGN PATENT DOCUMENTS

JP 2005-235725 9/2005

OTHER PUBLICATIONS

Notification of Reason for Rejection for Japanese Patent Application No. 2012-213104 dated Jan. 7, 2014, 7 pgs.
(Continued)

*Primary Examiner* — Angelo Trivisonno
(74) *Attorney, Agent, or Firm* — Amin, Turocy & Watson LLP

(57) ABSTRACT

In accordance with one embodiment, there is provided a photovoltaic cell module including a plurality of photovoltaic cell structures including a hole transport layer and an electron transport layer which are disposed on a common photoelectric conversion layer so that electromotive force polarities are alternately different, wherein the photovoltaic cell structures are electrically connected in series.

5 Claims, 6 Drawing Sheets

(52) U.S. Cl.
CPC ........ *H01L 51/442* (2013.01); *H01L 51/0037* (2013.01); *H01L 51/4226* (2013.01); *H01L 2251/308* (2013.01); *Y02E 10/549* (2013.01); *Y02P 70/521* (2015.11)

(58) Field of Classification Search
CPC ............. H01L 51/4226; H01L 51/0037; Y02P 70/521; Y02E 10/549
See application file for complete search history.

(56) References Cited

U.S. PATENT DOCUMENTS

| | | |
|---|---|---|
| 2012/0055536 A1 | 3/2012 | Saito et al. |
| 2012/0234372 A1 | 9/2012 | Takayama et al. |
| 2012/0234389 A1 | 9/2012 | Oooka et al. |
| 2014/0083479 A1 | 3/2014 | Takayama et al. |

OTHER PUBLICATIONS

Non-Final Office Action for U.S. Appl. No. 14/027,526 dated Jan. 28, 2015, 25 pages.
Shin et al., "Effects of functional groups at perylene dimide derivatives on organic photovoltaic device application", J. Mater. Chem., 2006, 16, 384-390.
Final Office Action for U.S. Appl. No. 14/027,526 dated Aug. 20, 2015, 13 pages.
Non-Final Office Action for U.S. Appl. No. 14/027,526 dated Jan. 15, 2016, 17 pages.
Krebs, "Polyment solar cell modules prepared using roll-to-roll methods: Knife-over-edge coating, slot-die coating and screen printing," Solar Energy Materials & Solar Cells 93 (2009) 465-475.
Final Office Action for U.S. Appl. No. 14/027,526 dated Jul. 19, 2016, 39 pages.

* cited by examiner

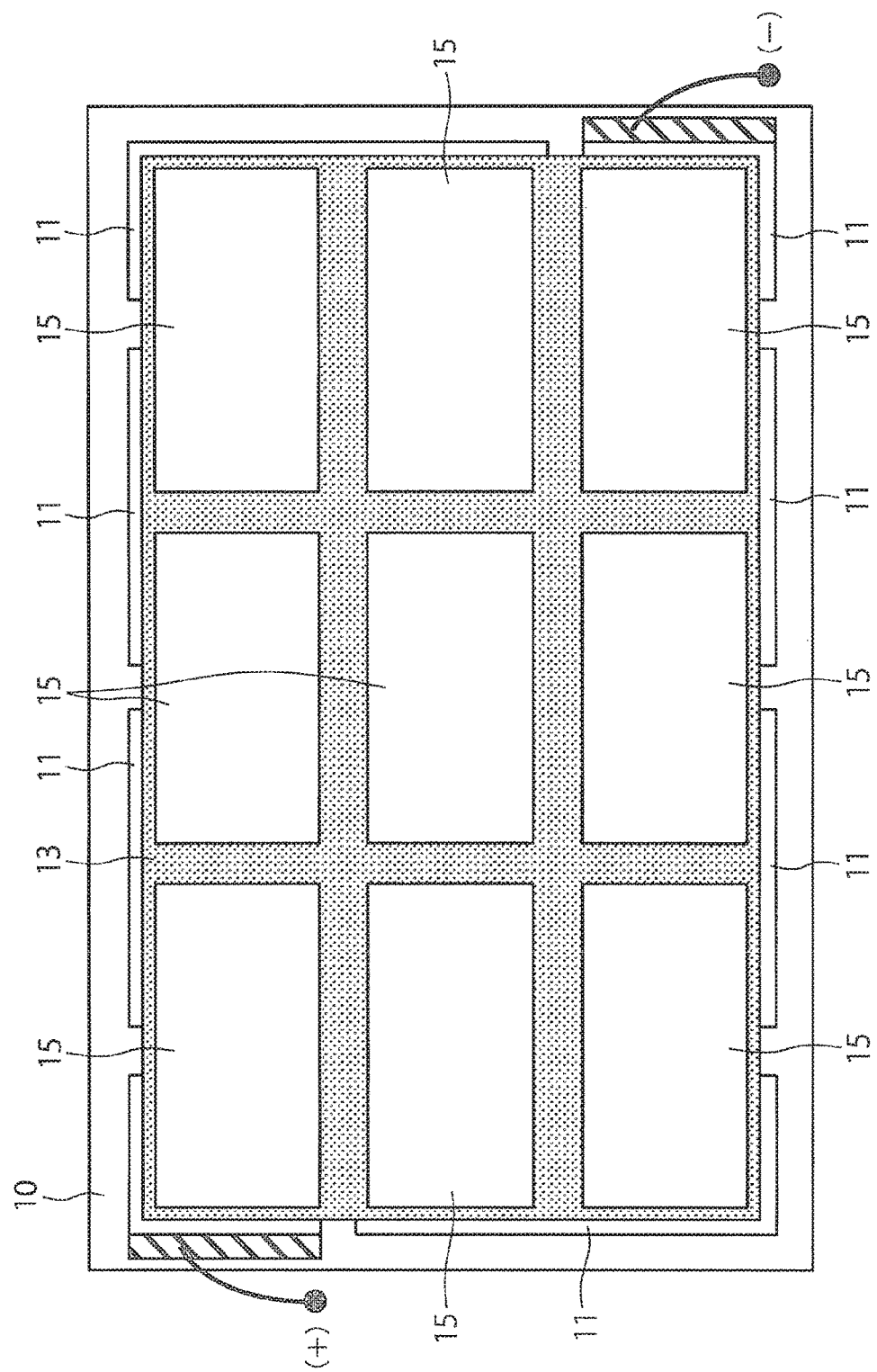

PHOTOVOLTAIC CELL MODULE

CROSS REFERENCE TO RELATED APPLICATIONS

This application is a Continuation of co-pending U.S. patent application Ser. No. 14/027,526, filed on Sep. 16, 2013, the entire contents of which are incorporated herein by reference.

This application is based upon and claims the benefit of priority from the prior Japanese Patent Application No. 2012-213104, filed on Sep. 26, 2012, the entire contents of which are incorporated herein by reference.

FIELD

Embodiment described herein relate generally to a photovoltaic cell module.

BACKGROUND

An organic thin film photovoltaic cell is a photovoltaic cell prepared by using an organic thin film semiconductor in which a conductive polymer, fullerene and the like are combined. In the organic thin film photovoltaic cell, a photoelectric conversion film can be produced by a simple method such as coating or printing and a lower cost may be achieved, compared with a photovoltaic cell based on an inorganic material such as silicon, Cu—In—Ga—Se (CIGS) or CdTe. In contrast, there is such a problem that the photoelectric conversion efficiency and life of the organic thin film photovoltaic cell are low in comparison with inorganic photovoltaic cells in the related art.

One of factors responsible for the decreased photoelectric conversion efficiency of an organic thin film photovoltaic cell module is such a factor that the efficient extraction of photocurrent to the outside requires reduction in photovoltaic cell area to around 10 to 20 mm since a transparent electrode has relatively high resistivity. When photovoltaic cells composing the photovoltaic cell module are small as described above, the total area of spaces in which the photovoltaic cells are electrically connected is increased to decrease an opening ratio in the photovoltaic cell module.

The problem occurs not only in organic thin film photovoltaic cells but also in inorganic photovoltaic cells in which a transparent electrode of amorphous silicon, CIGS, or the like is used. In the inorganic photovoltaic cells, various devices have been accomplished for improving the opening ratio of a photovoltaic cell module. For example, a wiring pathway for connection between photovoltaic cells has been formed by a laser or mechanical scribing method in order to reduce connection spaces between the photovoltaic cells. However, laser and mechanical scribing systems have not yet been effectual measures in organic thin film photovoltaic cells. The systems are systems by which a part of a formed photoelectric conversion layer is thermally or mechanically removed and connection wiring is passed therein; however, in the laser scribing, since the efficiency of converting laser light into heat in an organic semiconductor layer is low, the organic semiconductor layer cannot be satisfactorily removed. In the mechanical scribing, it is also difficult to scrape off an organic semiconductor layer with a sharp share point, so that a fine connection wiring pathway cannot be formed, since the elasticity of the organic semiconductor layer is higher than that of an inorganic material. It is also a phenomenon peculiar to an organic semiconductor layer that string-shaped cutting scraps are easily generated and cannot be completely removed.

BRIEF DESCRIPTION OF THE DRAWINGS

FIG. 6 is a plan view that illustrates the configuration of the photovoltaic cell module according to the embodiment.

DETAILED DESCRIPTION

A photovoltaic cell module according to an embodiment of the present invention includes a plurality of photovoltaic cell structures including a hole transport layer and an electron transport layer which are disposed on a single photoelectric conversion layer so that electromotive force polarities are alternately different, wherein the photovoltaic cell structures are electrically connected in series.

Embodiments will now be explained with reference to the accompanying drawings. In addition, preferred embodiments among the embodiments of the present invention are exemplified below and the scope of the present invention is not thus limited only to the scopes of the specific embodiments exemplified below.

Figure 1:
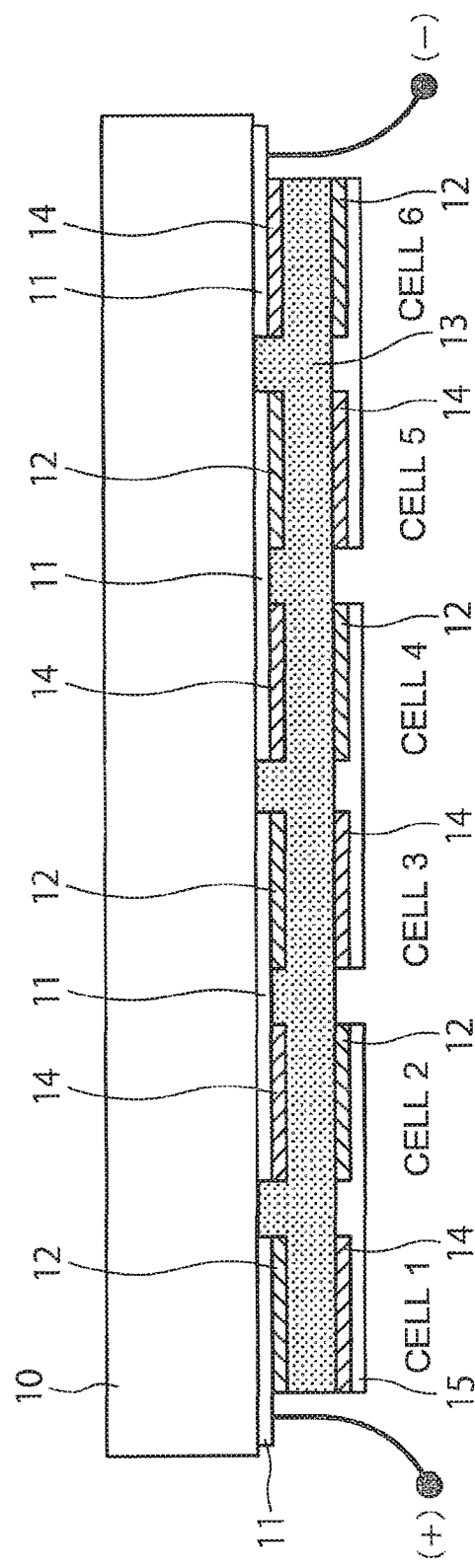
FIG. 1 is a cross-sectional view that illustrates the configuration of a photovoltaic cell module according to an embodiment.

FIG. 1 is a cross-sectional configuration view of a photovoltaic cell module according to an embodiment of the present invention.

In FIG. 1, there is included a photovoltaic cell structure in which a hole transport layer 12 and an electron transport layer 14 are disposed on a common photoelectric conversion layer 13 so that an electromotive force polarity alternates. As is clear from FIG. 1, the structure is not a configuration in which photovoltaic cells are independent but is the photovoltaic cell structure configured using the single photoelectric conversion layer 13. Characteristics similar to those of the independent photovoltaic cells are obtained even by using such a single photoelectric conversion layer 13. In addition, such photovoltaic cell structures are electrically connected in series. The measure of the electrical connection in series is taken with a transparent electrode layer 11 and an opposite electrode layer 15 paired up with the transparent electrode layer 11. FIG. 1 illustrates the photovoltaic cell module according to the embodiment of the present invention, in which one surface of each photovoltaic cell structure having the configuration is disposed on one substrate 10.

In other words, the photovoltaic cell structures have the configuration of being formed on the substrate 10 so that electromotive force polarities are alternately changed. Each cell structure includes the transparent electrode layer 11, the hole transport layer 12, the photoelectric conversion layer 13, the electron transport layer 14, and the opposite electrode 15. In each photovoltaic cell structure, the side in which the hole transport layer 12 is formed becomes a positive electrode (anode) while the side in which the electron transport layer 14 is formed becomes a negative electrode (cathode). The photoelectric conversion layer 13 is preferably a thin film having a structure with a bulk heterojunction of p-type and n-type semiconductors.

In FIG. 1, six photovoltaic cell structures are described and an embodiment in which all of the photovoltaic cell structures are connected in series is described. However, the number of photovoltaic cell structures is not limited only to six without limitation to the case in which all the photovoltaic cells are connected in series. The photovoltaic cell module according to an embodiment of the present invention encompasses photovoltaic cell modules in which the number of photovoltaic cells is plural (i.e., two or more) and plural (i.e., two or three or more) structures of all the photovoltaic cell structures are connected in series.

The plural photovoltaic cell structures disposed on one substrate 10 are disposed so that the electromotive force polarities of photovoltaic cell structures that are adjacent to each other are alternately different. In other words, in the photovoltaic cell module according to the embodiment of FIG. 1, the structures are disposed so that the electromotive force polarities of the cell 1 and the cell 2, of the cell 2 and the cell 3, of the cell 3 and the cell 4, of the cell 4 and the cell 5, and of the cell 5 and the cell 6 are different.

In addition, a transparent electrode layer 11 is patterned every two adjacent cells and is insulated from adjacent transparent electrodes 11. An opposite electrode layer 15 paired up with a transparent electrode layer 11 is also patterned every two adjacent cells. The opposite electrode layer 15 is patterned in the relationship of deviation of the phase thereof from that of the transparent electrode layer by one cell. In other words, in the photovoltaic cell module according to the embodiment of FIG. 1, each transparent electrode layer 11 forms one pattern in the cell 2 and the cell 3 or in the cell 4 and the cell 5 while each opposite electrode layer 15 forms one pattern in the cell 1 and the cell 2, in the cell 3 and the cell 4, or in the cell 5 and the cell 6.

In such a manner, "electron transport layer 14 in cell 1" and "hole transport layer 12 in cell 2" are electrically connected by "opposite electrode layer 15", "electron transport layer 14 in cell 2" and "hole transport layer 12 in cell 3" are electrically connected by "transparent electrode layer 11", and the plural photovoltaic cell structures (i.e., the cell 1, the cell 2, the cell 3, the cell 4, the cell 5, and the cell 6) are electrically connected in series by establishing such electrical connections in the cell 1 to the cell 6. The transparent electrode layer 11 having the hole transport layer 12 in the cell 1 is connected as the positive electrode of the whole photovoltaic cell module, in which the cells 1 to 6 are connected in series, to the outside, while the transparent electrode layer 11 having the electron transport layer 14 in the cell 6 is connected as the negative electrode of the whole photovoltaic cell module, in which the cells 1 to 6 are connected in series, to the outside, so that a power generated in the photovoltaic cell module is fed to the outside.

In addition, the photoelectric conversion layer 13 composing the plural photovoltaic cell structures (i.e., the cell 1 to the cell 6) is formed as a common layer, i.e., as a continuous layer, in the photovoltaic cell module according to the embodiment of the present invention, illustrated in FIG. 1.

As described above, the plural photovoltaic cell structures are planarly connected in the photovoltaic cell module according to the embodiment of the present invention. Therefore, a space between such cells (e.g., a spacing between the cell 1 and the cell 2, a spacing between the cell 2 and the cell 3, etc.) can be shortened. In accordance with the embodiment of the present invention, the space between the cells can be shortened to, e.g., 1 to 2 mm, preferably 0.5 to 1.5 mm, since the space between the cells can be determined depending on the accuracy of the patterning of the electrodes and the accuracy of the patterning of the hole transport layer and the electron transport layer.

Accordingly, it is not necessary to remove a part of an electron transport layer, a photoelectric conversion layer, or a hole transport layer by, e.g., laser scribing, mechanical scribing, or the like to make a connection wiring space in order to establish a three-dimensional connection from a transparent electrode layer to an opposite electrode layer as in the case of a series connection method in the related art.

As a result, the amount of power generation per unit area of a photovoltaic cell module can be increased in the photovoltaic cell module according to the embodiment of the present invention in comparison with photovoltaic cell modules in the related art.

Figure 2:
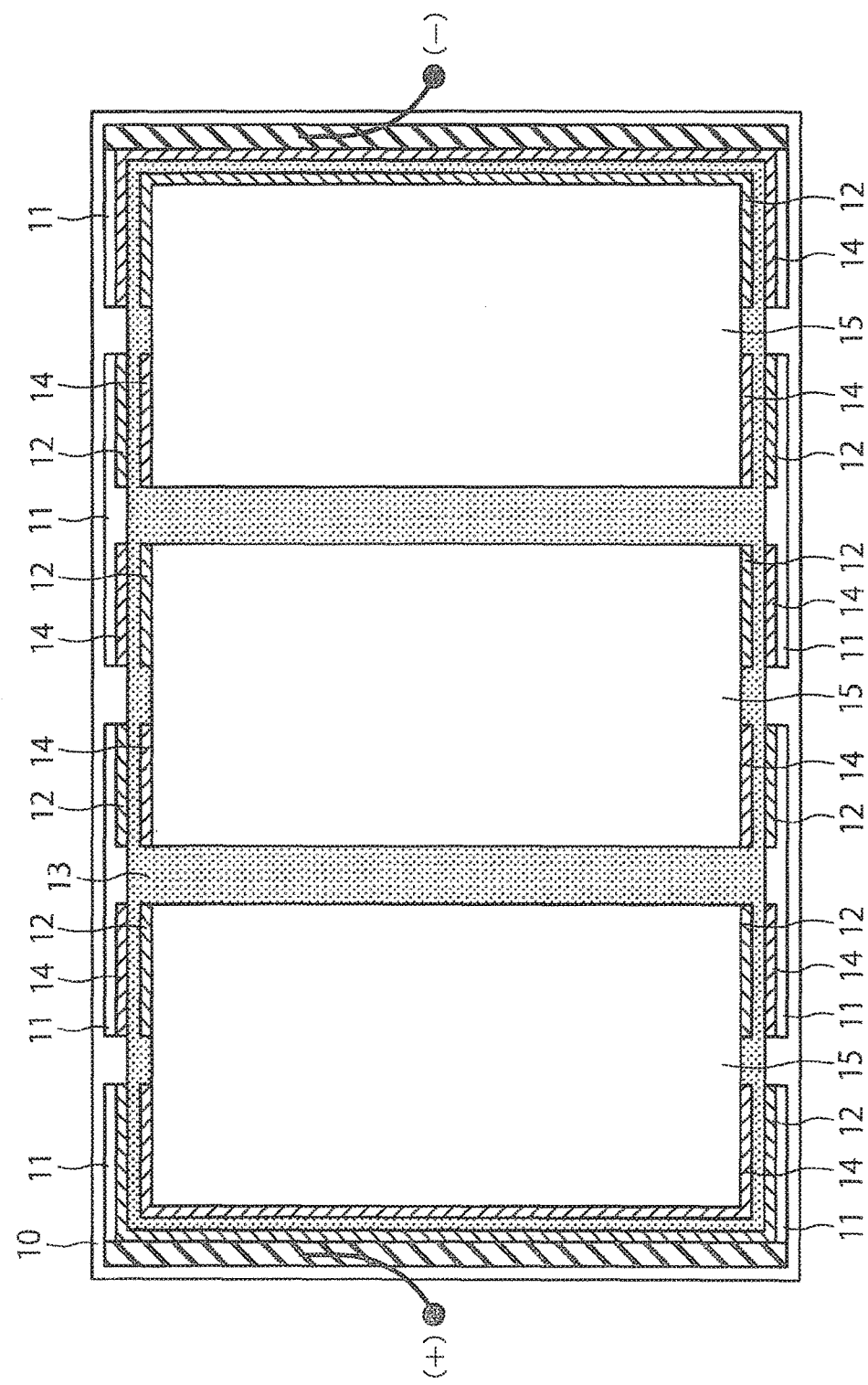
FIG. 2 is a plan view that illustrates the configuration of the photovoltaic cell module according to the embodiment.

FIG. 2 is a plan view that illustrates the configuration of the photovoltaic cell module according to the embodiment of the present invention, illustrated in FIG. 1. In FIG. 2, in order to easily understand the configuration of the photovoltaic cell module, each opposite electrode layer 15, each electron transport layer 14, the photoelectric conversion layer 13, and each hole transport layer 12 are drawn to be smaller for a descriptive purpose, and the ends of each electron transport layer 14, the photoelectric conversion layer 13, and each hole transport layers 12 are exposed. However, as is clear from the cross-sectional view of FIG. 1, each electron transport layer 14, the photoelectric conversion layer 13, and each hole transport layer 12 are concealed by each opposite electrode layer 15.

In the photovoltaic cell module according to the embodiment of the present invention, the photovoltaic cell module with a series connection can be formed, without laser scribing or mechanical scribing, by alternately arranging the cells having different electromotive force polarities only by patterning each hole transport layer and each electron transport layer as described above, and the number of apparatuses used can be therefore reduced to decrease a production cost.

In accordance with the embodiment of the present invention, since a plurality of cells can be formed on one substrate, any partition is unnecessary, and the photoelectric conversion layers can be formed in the regions of all the cell structures at one time, a production process becomes simple and yield is also improved. The organic thin film photovoltaic cell module according to the present invention is composed as the aggregate of the cells.

Further, the photovoltaic cell module according to the embodiment of the present invention is characterized in that the photoelectric conversion layer composing the plural photovoltaic cells is formed as a continuous layer. As a result, in accordance with the embodiment of the present invention, the photoelectric conversion layer can be collectively formed as a common continuous layer over the plural photovoltaic cell structures at one time. As a result, the photoelectric conversion layer can be stably and efficiently formed with the reduced unevenness of the respective cell structures.

Since a photoelectric conversion layer has the function of converting light energy into electric energy, the improvement and stabilization of the characteristics thereof are particularly demanded for achieving the high performance of photovoltaic cell modules. In particular, in a photovoltaic cell module in which a plurality of cells are connected in series, the cell having the lowest characteristics of the plurality of cells connected in series may restrict the performance of the overall photovoltaic cell module. In accordance with the embodiment of the present invention, since the photoelectric conversion layer can be formed as a continuous layer over the plural photovoltaic cell structures at one time as described above, the formation can be stably performed with the reduced unevenness of the respective cell structures, and the achievement of the high performance of the photovoltaic cell module, improvement in durability, stable production and reduction in production cost can be therefore accomplished.

<Specific Details of Each Component>

Each component of the photovoltaic cell module according to the embodiment of the present invention will be described below.

«Substrate»

The substrate 10 is intended mainly to support the other components.

Preferably, the substrate 10, on which an electrode can be formed, is not changed in quality by heat or an organic solvent.

Examples of materials for the substrate 10 include inorganic materials such as alkali-free glass and quartz glass; plastics such as polyethylene, polyethylene terephthalate (PET), polyethylene naphthalate (PEN), polyimide, polyamide, polyamide-imide, liquid crystal polymer and cycloolefin polymer; metal substrates such as polymeric films, stainless steel (SUS) and silicon; and the like. Especially, alkali-free glass and polyethylene naphthalate (PEN) are particularly preferred.

The substrate 10 that is transparent is used when disposed on a side on which light is incident. When an electrode on the side opposite to the substrate is transparent or semi-transparent, the substrate that is opaque may also be used. The thickness of the substrate is not particularly limited as long as the substrate has strength sufficient for supporting the other components, but is preferably 0.5 to 1.5 mm.

When the substrate 10 is used as a transparent substrate on the light incident side, light can be efficiently taken to improve the energy conversion efficiency of the photovoltaic cell structures, for example, by placing an anti-reflection film having a moth-eye structure on the light incident surface. The moth-eye structure has a structure in which the surface has regular projection alignment of around 100 nm, and a refractive index is continuously changed in a thickness direction by the projection structure. Therefore, the mediation of the nonreflective film causes a change surface with discontinuous refractive indices to disappear, and light reflection is thus reduced to improve the photoelectric conversion efficiency of the photovoltaic cell structures.

«Transparent Electrode Layer»

The transparent electrode layer 11 is stacked on the substrate 10. A material for the transparent electrode layer 11 is not particularly limited as long as the material has electrical conductivity. Typically, the transparent electrode layer 11 can be formed by forming a film with a transparent or semi-transparent material having electrical conductivity by a vacuum deposition method, a sputtering method, an ion plating method, a plating method, a coating method, or the like. Examples of the transparent or semi-transparent electrode material include electrically-conductive metal oxide films, semi-transparent metallic thin films, and the like. Specifically, a film produced using electrically conductive glass comprising indium oxide, zinc oxide, tin oxide; indium tin oxide (ITO), fluorine-doped tin oxide (FTO) or indium zinc oxide, which is a composite thereof; or the like (NESA or the like), gold, platinum, silver, copper, or the like is used. Particularly, ITO or FTO is preferred. Polyaniline and derivatives thereof, polythiophene and derivatives thereof, and the like, which are organic conductive polymers, may also be used as such electrode materials. The film thickness of the transparent electrode 11 is preferably 30 to 300 nm in the case of ITO. The thickness of less than 30 nm results in reduction in electrical conductivity to increase resistance and thus causes photoelectric conversion efficiency to be decreased. When the thickness is more than 300 nm, ITO has no flexibility and may be cracked by applying stress. The sheet resistance of the transparent electrode 11 is preferably as low as possible and is preferably 10 Ω/square or less.

The transparent electrode layer 11 may be a single layer or may be prepared by stacking layers comprising materials having different work functions.

In particular, the surface of the transparent electrode layer 11 brought into contact with the hole transport layer 12 preferably has a work function of 4.5 or more. Further, the surface of the transparent electrode layer 11 brought into contact with the electron transport layer 14 preferably has a work function of 4.5 or less. A method for making the surface of the transparent electrode layer 11 have the specified work functions is arbitrary. In accordance with an embodiment of the present invention, for example, the method such as a vacuum deposition method, a sputtering method, or a coating method is preferred.

«Hole Transport Layer»

The hole transport layer 12 is disposed between the photoelectric conversion layer 13 and the transparent electrode layer 11 or the opposite electrode layer 15. The functions of the hole transport layer 12 are: to level the recesses and projections of an anode electrode in a lower section to prevent a photovoltaic cell element from short-circuiting; to efficiently transport only holes; to prevent excitons generated in the vicinity of the interface of the photoelectric conversion layer 13 from disappearing; and the like. As a material for the hole transport layer 12, there can be used a polythiophene-based polymer such as PEDOT/PSS (poly(3,4-ethylenedioxythiophene)-poly(styrenesulfonate)) or an organic conductive polymer such as polyaniline or polypyrrole. Examples of representative products of the polythiophene-based polymer include Clevios PH500, Clevios PH, Clevios PV P Al 4083, and Clevios HIL1.1 from H.C. Starck GmbH. As an inorganic material, molybdenum oxide is a preferable material.

When Clevios PH500 is used as the material for the hole transport layer 12, a film thickness is preferably 20 to 100 nm. When the thickness is too small, the effect of preventing a lower electrode from short-circuiting is lost to make a short circuit. When the thickness is too large, film resistance is increased to restrict generated electric current and phototranstormation efficiency is therefore decreased.

A method for forming the hole transport layer 12 is not particularly limited as long as the method is a method capable of forming a thin film. For example, the layer can be coated by a spin coating method. A material for the hole transport layer 12 is coated in a desired film thickness, followed by heat-drying the material by a hot plate or the like. It is preferable to heat-dry the material at 140 to 200° C. for around several minutes to 10 minutes. It is desirable to use a solution to be coated, which has been filtrated through a filter beforehand.

«Photoelectric Conversion Layer»

The photoelectric conversion layer 13 is disposed between the hole transport layer 12 and the electron transport layer 14. The photovoltaic cell module according to a preferred embodiment of the present invention is a bulk heterojunction type photovoltaic cell module.

The bulk heterojunction type photovoltaic cell module is characterized in that p-type and n-type semiconductors are mixed in the photoelectric conversion layer 13 to form a microlayer separation structure. In the bulk heterojunction type, the p-type and n-type semiconductors which are mixed form a pn junction with a nano-order size in the photoelectric conversion layer and electric current is obtained using photocharge separation occurring on a junction surface. The p-type semiconductor is composed of a material having an electron-donating property. In contrast, the n-type semiconductor is composed of a material having an electron-accepting property. In accordance with an embodiment of the present invention, at least one of the p-type and n-type semiconductors may be an organic semiconductor.

For the p-type organic semiconductor, there can be used, for example, polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having aromatic amine in a side or main chain, polyaniline and derivatives thereof, phthalocyanine derivatives, porphyrin and derivatives thereof, polyphenylenevinylene and derivatives thereof, polythienylenevinylene and derivatives thereof, and the like. They may also be used in combination. There may also be used copolymers thereof, examples of which include a thiophene-fluorene copolymer, a phenyleneethynylene-phenylenevinylene copolymer, and the like.

The preferred p-type organic semiconductor comprises polythiophene or a derivative thereof which is a n-conjugated conductive polymer. In polythiophene and derivatives thereof, excellent stereoregularity can be secured and solubility into a solvent is comparatively high. Polythiophene and derivatives thereof are not particularly limited as long as they are compounds having a thiophene skeleton. Specific examples of polythiophene and derivatives thereof include polyalkylthiophenes such as poly(3-methylthiophene), poly(3-butylthiophene), poly(3-hexylthiophene), poly(3-octylthiophene), poly(3-decylthiophene) and poly(3-dodecylthiophene); polyarylthiophenes such as poly(3-phenylthiophene) and poly(3-p-alkylphenylthiophene); polyalkylisothionaphthenes such as poly(3-butylisothionaphthene), poly(3-hexylisothionaphthene), poly(3-octylisothionaphthene) and poly(3-decylisothionaphthene); polyethylenedioxythiophene; and the like.

In recent years, a derivative such as PCDTBT (poly[N-9″-hepta-decanyl-2,7-carbazole-alt-5,5-(4′,7′-di-2-thienyl-2′,1′,3′-benzothiadiazole)]) as a copolymer comprising carbazole, benzothiadiazole and thiophene has been known as a compound by which excellent photoelectric conversion efficiency is obtained.

A film can be formed with the conductive polymers by coating a solution dissolved in a solvent. Accordingly, there is an advantage that an organic thin film photovoltaic cell with a large area can be manufactured at a low cost in an inexpensive facility by a printing method or the like.

For the n-type organic semiconductor, fullerene and derivatives thereof are preferably used. A fullerene derivative as used herein is not particularly limited as long as the derivative has a fullerene skeleton. Specific examples thereof include derivatives formed by using C60, C70, C76, C78, C84, and the like as basic skeletons. In the fullerene derivative, carbon atoms in the fullerene skeleton may be modified by arbitrary functional groups and the functional groups may be bound to each other to form a ring. Examples of the fullerene derivative include a fullerene-binding polymer. A fullerene derivative that contains a functional group having a high affinity for a solvent and is highly soluble in a solvent is preferable.

Examples of the functional group in the fullerene derivative include a hydrogen atom; a hydroxyl group; halogen atoms such as a fluorine atom and a chlorine atom; alkyl groups such as a methyl group and an ethyl group; alkenyl groups such as a vinyl group; a cyano group; alkoxy groups such as a methoxy group and an ethoxy group; aromatic hydrocarbon groups such as a phenyl group and a naphthyl group; aromatic heterocyclic groups such as a thienyl group and a pyridyl group; and the like. Specific examples thereof include hydrogenated fullerenes such as C60H36 and C70H36; oxide fullerenes such as C60 and C70; fullerene metal complexes; and the like.

Among the above, it is particularly preferable to use 60PCBM ([6,6]-phenyl C61 methyl butyrate ester) or 70PCBM ([6,6]-phenyl C71 methyl butyrate ester) as the fullerene derivative.

It is preferable to use C70 when unmodified fullerene is used. Fullerene C70 has a high photo-carrier generation efficiency and is suitable for use in the organic thin film photovoltaic cell.

The mixing ratio of the n-type organic semiconductor and the p-type organic semiconductor in the photoelectric conversion layer is preferably n:p=1:2 to 4:1 as the content of the n-type organic semiconductor when the p-type semiconductor is a P3AT-based semiconductor. When the p-type semiconductor is a PCDTBT-based semiconductor, the mixing ratio of the n-type organic semiconductor and the p-type organic semiconductor is preferably n:p=1:1 to 8:1.

In order to coat an organic semiconductor, dissolution in a solvent may be performed. Examples of the solvent used therefor include unsaturated hydrocarbon-based solvents such as toluene, xylene, tetralin, decalin, mesitylene, n-butylbenzene, sec-butylbenzene and tert-butylbenzene; halogenated aromatic hydrocarbon-based solvents such as chlorobenzene, dichlorobenzene and trichlorobenzene; halogenated saturated hydrocarbon-based solvents such as carbon tetrachloride, chloroform, dichloromethane, dichloroethane, chlorobutane, bromobutane, chloropentane, chlorohexane, bromohexane and chlorocyclohexane; and ethers such as tetrahydrofuran and tetrahydropyran. Halogen-based aromatic solvents are particularly preferred. The solvents may be used singly or in the form of a mixture.

Examples of methods for coating a solution to form a film include spin coating, dip coating, casting, bar coating, roll coating, wire bar coating, spraying, screen printing, gravure printing, flexographic printing, offset printing, gravure offset printing, dispenser coating, nozzle coating, capillary coating, and inkjet methods, etc. The coating methods may be used singly or in combination.

«Electron Transport Layer»

The electron transport layer 14 is disposed between the photoelectric conversion layer 13 and the transparent electrode layer 11 or the opposite electrode layer 15. The electron transport layer 14 has a function of blocking holes to efficiently transport only electrons and a function of preventing excitons generated at the interface between the photoelectric conversion layer 13 and the electron transport layer 14 from disappearing.

Examples of materials for the electron transport layer 14 include metal oxides such as amorphous titanium oxide obtained by hydrolyzing titanium alkoxide by the sol-gel method. The film formation method is not particularly limited as long as a thin film can be formed. Examples of the film formation method include a spin coating method. It is desirable to form a film with a film thickness of 5 to 20 nm when titanium oxide is used as the material for the electron transport layer 14. When the film thickness is smaller than the above-described range, the hole blocking effect is deteriorated. Therefore, generated excitons may be deactivated before dissociating into electrons and holes, and it may be impossible to efficiently extract electric current. When the film thickness is too large, the film resistance is increased, generated electric current is limited, and phototranstormation efficiency is therefore decreased. It is desirable to use a coating solution that has been filtrated through a filter beforehand. After coating a film with a predetermined thickness, the film is heat-dried using a hot plate or the like. The film is heat-dried at 50° C. to 100° C. for around several minutes to 10 minutes while promoting hydrolysis in the air. Metal calcium is a preferable material as the inorganic material.

«Opposition Electrode Layer»

For the opposite electrode layer 15, it is possible to form a film with a material having electrical conductivity, for example, by a vacuum deposition method, a sputtering method, an ion plating method, a plating method, a coating method, or the like. Examples of the electrode material include electrically-conductive metallic thin films, metal oxide films, and the like. It is preferable to use a material having a low work function in the opposite electrode 15 when the opposite electrode layer 15 is formed to be brought into contact with the electron transport layer 14. Examples of the material having a low work function include alkali metals, alkaline earth metals, and the like. Specific examples include Li, In, Al, Ca, Mg, Sm, Tb, Yb, Zr, Na, K, Rb, Cs, Ba, and alloys thereof.

The opposite electrode layer 15 may be a single layer or may be prepared by stacking layers comprising materials having different work functions. The material may also be an alloy of one or more of the materials having low work functions, and gold, silver, platinum, copper, manganese, titanium, cobalt, nickel, tungsten, tin, etc. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, a calcium-aluminum alloy, and the like.

In particular, the surface of the opposite electrode layer 15 brought into contact with the hole transport layer 12 preferably has a work function of 4.5 or more. Further, the surface of the opposite electrode layer 15 brought into contact with the electron transport layer 14 preferably has a work function of 4.5 or less. A method for making the surface of the opposite electrode layer 15 have the specified work functions is arbitrary. In accordance with an embodiment of the present invention, for example, the method such as a vacuum deposition method, a sputtering method, or a coating method is preferred.

The film thickness of the opposite electrode layer 15 is 1 nm to 500 nm, preferably 10 nm to 300 nm. When the film thickness is smaller than the above-described range, resistance becomes too high and generated charge cannot be sufficiently transferred to an external circuit. When the film thickness is large, the formation of the opposite electrode 15 requires long time and, therefore, material temperature is excessively increased to damage an organic layer to deteriorate performance. Further, a large amount of material is used. Therefore, the occupation time of the film formation apparatus is prolonged to lead to increase in cost.

EXAMPLES

First Example

In the present example, a glass plate as the substrate 10 and ITO as transparent electrode layer 11 were used, illustrated in FIG. 1. A titanium oxide layer as each electron transport layer 14 and a PEDOT:PSS layer as each hole transport layer 12 were formed on each transparent electrode layer 11. First, the PEDOT:PSS was coated in a rectangular slice shape by a die coating applicator. Then, the layer was dried at 150° C., followed by coating the titanium oxide layer by the die coating applicator and drying the layer at 100° C. In such a manner, each electron transport layer 14 and each hole transport layer 12 were formed on the transparent electrode layer 10.

Then, a solution in which a p-type organic semiconductor material and an n-type organic semiconductor material were dissolved was coated to be extended over the region of all the cells by the die coating applicator and was dried at 50° C.

Then, each electron transport layer 14 and each hole transport layer 12 were sequentially coated and dried in the same manner as described above.

Finally, aluminum was mask vapor deposited to form each opposite electrode 15.

As described above, in accordance with the present invention, the photovoltaic cell module having a high opening ratio was produced by a simple production method by separately coating each electron transport layer 14 and each hole transport layer 12.

Although each opposite electrode layer 15 was formed with aluminum in the above-described method for producing the module, the layer may also be formed using a plurality of conductive materials. Aluminum with a low work function is desirable for each electron transport layer 14 comprising titanium oxide in terms of a hole blocking characteristic, while a conductive material with a high work function is preferable for each hole transport layer 12 comprising PEDOT:PSS. Thus, the photovoltaic cell module that is further excellent in diode characteristic is obtained by forming an electrode with Au or Ag only on a portion brought into contact with each hole transport layer and then vapor-depositing aluminum on the whole opposite electrode layer 15. Further, when the conductive layer brought into contact with the hole transport layer 12 is formed, a production cost can be reduced by forming the layer with a conductive material that can be formed in a coating step. For example, a silver nanoink may be used instead of vapor deposition of Ag.

Similarly, an electrode can be formed using a plurality of conductive materials on a portion brought into contact with the electron transport layer 14 in the side of the transparent electrode layer 11. For example, the work function of the electrode side can be decreased by forming an ITO electrode and then coating/burning graphene only on a portion brought into contact with the electron transport layer 14.

Second Example

Figure 3:
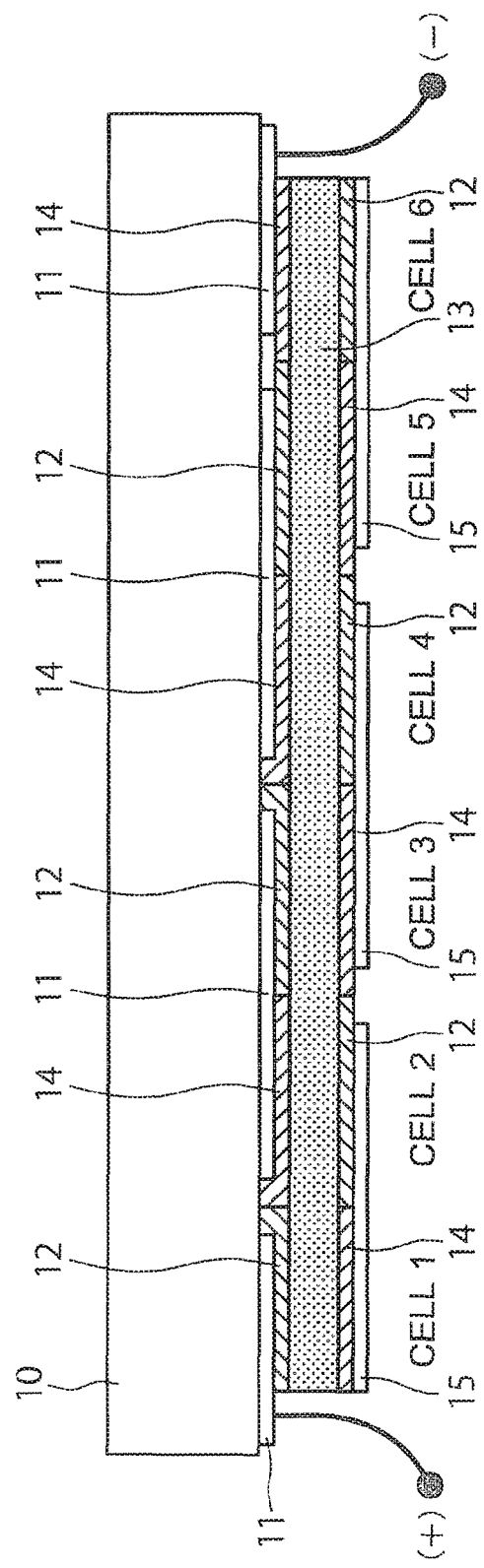
FIG. 3 is a cross-sectional view that illustrates the configuration of a photovoltaic cell module according to an embodiment.
Figure 4:
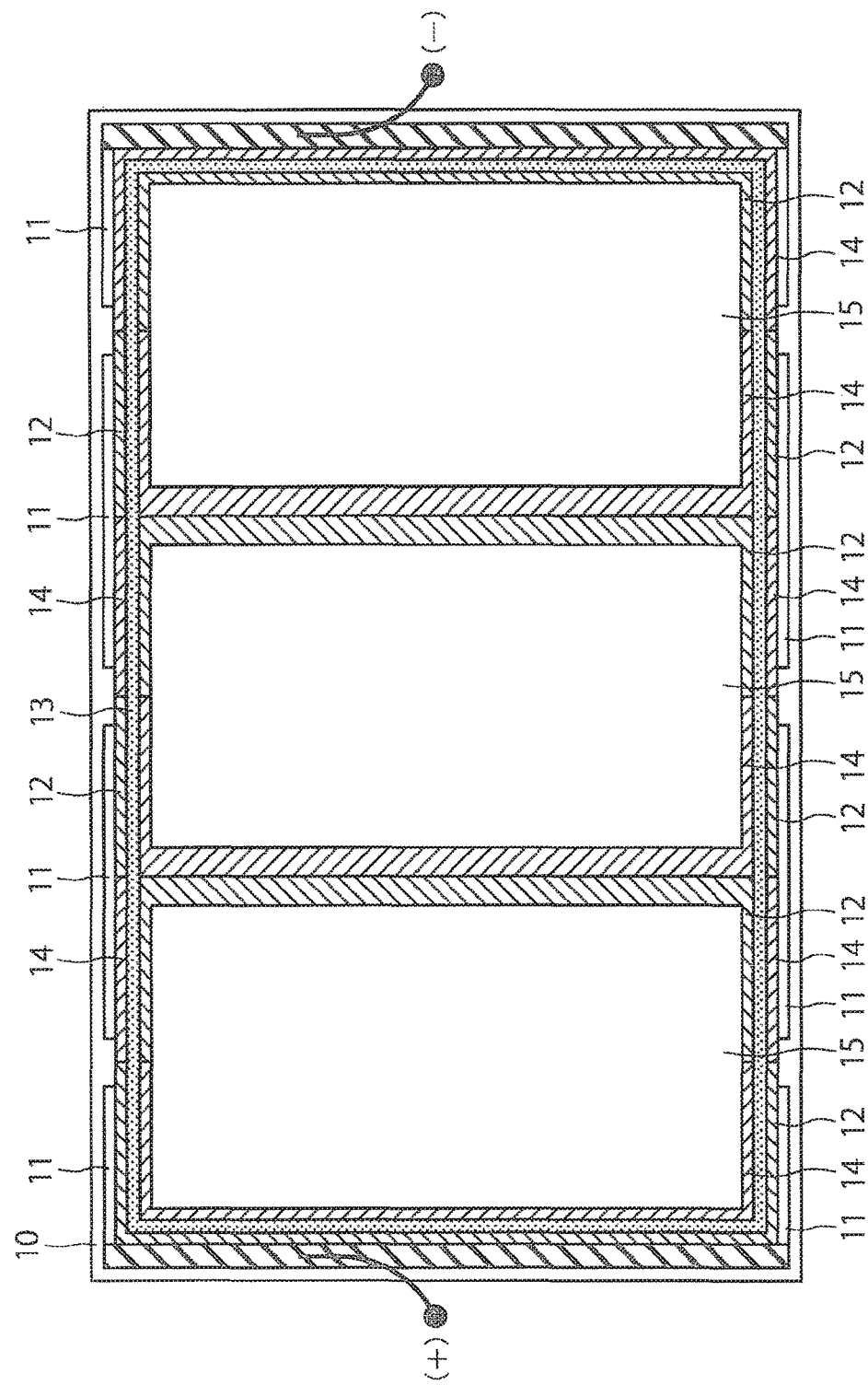
FIG. 4 is a plan view that illustrates the configuration of the photovoltaic cell module according to the embodiment.

FIG. 3 and FIG. 4 are views that give explanations about an embodiment of the present invention and illustrate a photovoltaic cell module. FIG. 3 is a cross-sectional view of an example in which a space between cells is further reduced, while FIG. 4 is a plan view thereof.

In the example of FIG. 1 described above, each electron transport layer 14 and each hole transport layer 12 are formed substantially on each transparent electrode layer 11 and the photoelectric conversion layer 13 covers the gaps between the transparent electrode layers 11; and, in the side of each opposite electrode layer 15, each electron transport layer 14 and each hole transport layer 12 are formed up to the border of each opposite electrode layer 15 and the electron transport layers 14 and the hole transport layers 12 are designed to be prevented from entering the gaps between the opposite electrode layers 15. The purpose thereof is to insulate the transparent electrode layers 11 next to each other and the opposite electrode layers 15 next to each other. Even in such a manner, the gaps between the transparent electrode layers 11 and between the opposite electrode layers 15 can be reduced specifically to 1 mm. As a result, an opening ratio of 90% or more is possible when the cell widths are 10 to 20 mm in the photovoltaic cell module.

In the photovoltaic cell module according to the embodiment of the present invention of FIG. 3, an opening ratio can be further improved by adjusting the resistivities of electron transport layers 14 and hole transport layers 12. As illustrated in FIG. 3, each electron transport layer 14 and each hole transport layer 12 can be formed in a gap between transparent electrode layers 11 next to each other or in a gap between opposite electrode layers 15 next to each other. In the example of FIG. 3, the thickness of each electron transport layer 14 is set to 5 to 20 nm and each electron transport layer 14 is formed to extend off each transparent electrode layer 11 by around 100 μm in order to reduce a resistance value in a thickness direction in which photoproduction current flows. In consideration of the resistance of each electron transport layer 14, the portion thereof extending off each transparent electrode layer 11 is as large as 5000 times or more the thickness thereof and substantially no current can be therefore considered to flow through the portion. Similarly, each hole transport layer 12 is also formed to extend off each transparent electrode by 400 μm. Since the resistance of each hole transport layer 12 is generally lower than that of each electron transport layer 14, the amount of the extending portion thereof is set to be large, so that substantially no current also flows through the portion due to the large amount of 400 μm.

As described above, each gap in the same plane between the transparent electrode layers 11 or between the opposite electrode layers 15 is covered with each hole transport layer 12 and each electron transport layer 14, substantially no current flows in the direction of the surface of each layer even when the two layers are brought into contact with each other, and a potential difference between the transparent electrode layers 11 that are next to each other can be therefore maintained.

As in the present example, by covering each gap between the transparent electrode layers 11 that are next to each other and each gap between the opposite electrode layers 15 that are next to each other with each hole transport layer 12 and each electron transport layer 14, the patterning accuracy of such a gap can be reduced specifically to 0.5 mm, since only the patterning accuracy between the transparent electrode layers 11 and of the opposite electrode layers may be considered. As a result, an opening ratio in the photovoltaic cell module can be improved.

Third Example

Figure 5:
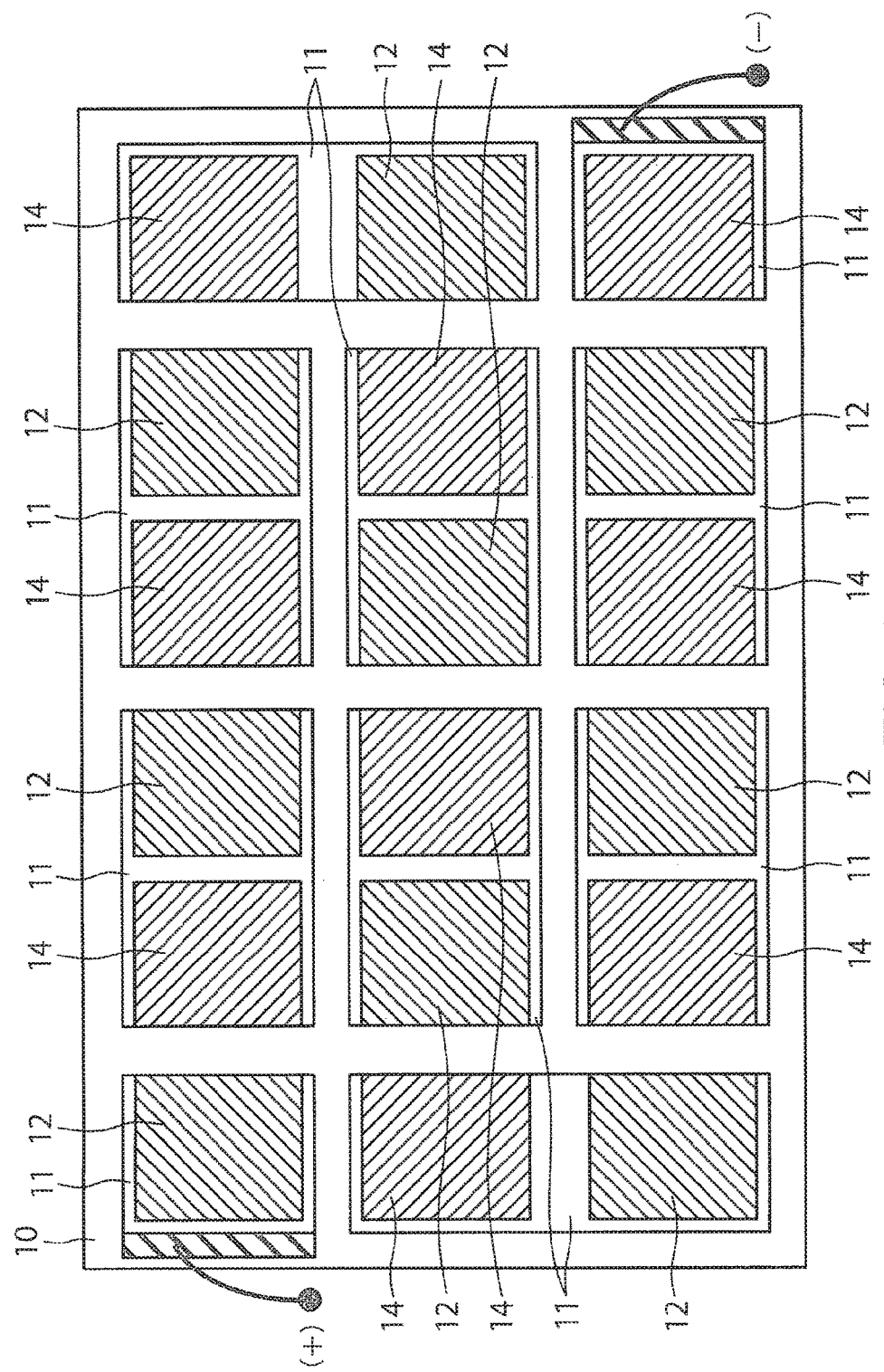
FIG. 5 is a plan view that illustrates the configuration of a photovoltaic cell module according to an embodiment.

FIG. 5 and FIG. 6 are views that give explanations about a third embodiment of the present invention and illustrate a photovoltaic cell module. FIG. 5 illustrates only the configuration in which each transparent electrode layer 11 is placed on a substrate 10 and each electron transport layer 14 and each hole transport layer 12 are formed thereon, while FIG. 6 illustrates the configuration of the photovoltaic cell module, in which a photoelectric conversion layer 13 is collectively formed as a continuous layer on each electron transport layer 14 and each hole transport layer 12 described above, each electron transport layer 14 and each hole transport layer 12 are formed thereon, and each opposite electrode layer 15 is further formed.

As illustrated in the views, the photovoltaic cell module according to the third embodiment of the present invention is prepared by disposing a plurality of photovoltaic cell structures including the transparent electrode layer 11, the hole transport layer 12, the photoelectric conversion layer 13, the electron transport layer 14, and the opposite electrode layer 15 paired up with the transparent electrode layer 11 on one insulating substrate 10, in which the photovoltaic cell structures are disposed so that the electromotive force polarities of the photovoltaic cell structures adjacent to each other are alternately different in two longitudinal and lateral directions, the plural photovoltaic cell structures are electrically connected in series, and the photoelectric conversion layer 13 composing the plural photovoltaic cell structures is formed as a common continuous layer.

In such a photovoltaic cell module according to the embodiment, the number of photovoltaic cell structures that can be connected in series can be more increased, so that an output voltage in the photovoltaic cell module can be enhanced.

When the cells are aligned only in the lateral direction as in the case of FIG. 2 described above, the number of connections in series is at most around 15 to 23 and an output voltage is around 9 to 15 V in the photovoltaic cell module with a width of 20 cm to 30 cm. By establishing connections in series in the longitudinal and lateral directions as in the present example, the number of the connections in series can be increased to around 10 times to obtain a photovoltaic cell module output of 90 to 150 V. The scope of application of the photovoltaic cell module is significantly expanded by obtaining such a high output voltage in a photovoltaic cell module unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. The process for producing a photovoltaic cell module comprising a plurality of photovoltaic cell structures, comprising:

placing a plurality of transparent electrodes on a substrate, wherein gaps are placed between said plurality of transparent electrodes and widths of said gaps are 0.5 to 1.5 mm;

fully covering said plurality of transparent electrodes and said gaps with a first plane comprising first hole transport layers and first electron transport layers arranged alternately, wherein said first hole transport layers and said first electron transport layers are contacted on the surface of said plurality of transparent electrodes and in said gaps;

covering said first plane with a single common photoelectric conversion layer;

covering said single common photoelectric conversion layer with a second plane comprising second electron transport layers and second hole transport layers arranged alternately, wherein said second electron transport layers are placed on the opposite side of said first hole transport layers and said second hole transport layers are placed on the opposite side of said first electron transport layers; and placing a plurality of opposite electrodes on said second plane, wherein said plurality of photovoltaic cell structures comprising said plurality of transparent electrodes, said hole transparent layers, said single common photoelectric conversion layer, said electron transport layers and said opposite electrodes are electrically connected in series, wherein at least one of said hole transport layers, said single common photoelectric conversion layer and said electron transport layers are produced by coating.

2. The method according to claim 1, wherein widths of said plurality of photovoltaic cell structures are 10 to 20 mm.

3. The method according to claim 1, wherein thicknesses of said electron transport layers are 5 to 20 nm.

4. The method according to claim 1, wherein said plurality of photovoltaic cell structures are aligned in a longitudinal and lateral direction.

5. A photovoltaic cell module comprising:

a plurality of photovoltaic cell structures, each photovoltaic cell structure of the plurality of photovoltaic cell structures including:

a hole transport layer and an electron transport layer which are disposed on a common photoelectric conversion layer so that electromotive force polarities are alternately different;

a transparent electrode; and an opposite electrode;

wherein the plurality of photovoltaic cell structures are electrically connected in series, where adjacent photovoltaic cells are electrically connected by said transparent electrode or said opposite electrode, said electrodes being electrically connected to said hole transport layer or said electron transport layer;

said transparent electrodes of each photovoltaic cell structure collectively form a transparent electrode layer;

said opposite electrodes of each photovoltaic cell structure collectively form an opposite electrode layer;

a plurality of gaps in the transparent electrode layer and the opposite electrode layer, each respective gap of said plurality of gaps located at a respective perimeter of adjacent photovoltaic cells, and widths of said plurality of gaps are 0.5 to 1.5 mm, wherein each gap of said plurality of gaps is fully covered with said hole transport layer and said electron transport layer of adjacent photovoltaic cells, and each gap of said plurality of gaps is formed on a contact portion of said hole transport layer and said electron transport layer of said adjacent photovoltaic cells;

a first plane located between said transparent electrode layer and said common photoelectric conversion layer, the first plane comprising hole transport layers and electron transport layers arranged alternately; and a second plane located between said opposite electrode layer and said common photoelectric conversion layer, the second plane comprising hole transport layers and electron transport layers arranged alternately.

* * * * *